United States Patent
Ohashi (10) Patent No.: US 10,375,868 B2
(45) Date of Patent: Aug. 6, 2019

(54) TAPE FEEDER

(71) Applicant: FUJI CORPORATION, Chiryu (JP)

(72) Inventor: Hiroyasu Ohashi, Toyota (JP)

(73) Assignee: FUJI CORPORATION, Chiryu (JP)

( * ) Notice: Subject to any disclaimer, the term of this patent is extended or adjusted under 35 U.S.C. 154(b) by 306 days.

(21) Appl. No.: 15/323,447

(22) PCT Filed: Jul. 4, 2014

(86) PCT No.: PCT/JP2014/067979
§ 371 (c)(1),
(2) Date: Jan. 3, 2017

(87) PCT Pub. No.: WO2016/002085
PCT Pub. Date: Jan. 7, 2016

(65) Prior Publication Data
US 2017/0142873 A1    May 18, 2017

(51) Int. Cl.
| | |
|---|---|
| *H05K 13/02* | (2006.01) |
| *B65H 19/12* | (2006.01) |
| *H05K 13/04* | (2006.01) |

(52) U.S. Cl.
CPC ............ *H05K 13/02* (2013.01); *B65H 19/12* (2013.01); *H05K 13/0417* (2013.01); *H05K 13/0419* (2018.08)

(58) Field of Classification Search
CPC ............... H05K 13/02; H05K 13/0417; H05K 13/0419; H05K 19/12
See application file for complete search history.

(56) References Cited

U.S. PATENT DOCUMENTS

| | | | | |
|---|---|---|---|---|
| 5,873,691 | A * | 2/1999 | Asai | ............... H05K 13/0417 414/416.01 |
| 2010/0239401 | A1 * | 9/2010 | Kim | ............... B65H 37/002 414/412 |
| 2011/0243695 | A1 * | 10/2011 | Hwang | ............ H05K 13/0215 414/412 |

(Continued)

FOREIGN PATENT DOCUMENTS

| | | |
|---|---|---|
| CN | 101835370 B | 10/2012 |
| JP | 2004-47951 A | 2/2004 |

(Continued)

OTHER PUBLICATIONS

Office Action dated Apr. 5, 2018 in Japanese Patent Application No. 2016-530795 (English translation only).

(Continued)

*Primary Examiner* — Michael E Gallion
(74) *Attorney, Agent, or Firm* — Oblon, McClelland, Maier & Neustadt, L.L.P.

(57) ABSTRACT

A tape feeder includes a reel holding section, a feeder main body, and a movable mechanism which is provided between the feeder main body and the reel holding section, and allows the reel holding section to relatively move with respect to the feeder main body. The movable mechanism is capable of changing a position of the reel holding section with respect to the feeder main body between an upper position and a lower position, and is capable of changing the position of the reel holding section between a proximity position and a separation position at least at the lower position.

5 Claims, 7 Drawing Sheets (56) References Cited

U.S. PATENT DOCUMENTS

2015/0115093 A1* 4/2015 Tanokuchi ........... H05K 13/021
                                                    242/560.1
2018/0242482 A1* 8/2018 Kunihiro ............ H05K 13/0417
2018/0332746 A1* 11/2018 Fukaya ................. H05K 13/02

FOREIGN PATENT DOCUMENTS

| JP | 2006-108420 A | 4/2006 |
| JP | 2013-149777 | 8/2013 |
| JP | 2014-82454 A | 5/2014 |

OTHER PUBLICATIONS

International Search Report dated Sep. 22, 2014 in PCT/JP2014/067979 filed Jul. 4, 2014.
Extended European Search Report dated Jun. 16, 2017 in Patent Application No. 14896345.7.

* cited by examiner

TAPE FEEDER

TECHNICAL FIELD

A technology disclosed in the present description relates to a tape feeder which supplies an electronic component to a board working machine.

BACKGROUND ART

A tape feeder is provided with a reel holding section at which a reel around which a tape that holds an electronic components is wound is held, and a feeder main body which feeds the tape from the reel to a board working machine. On the board working machine, a plurality of tape feeders are installed in parallel along the conveyance direction of a printed circuit board. In general, the reel holding section is wider than the feeder main body. Therefore, the number of tape feeders which can be installed on the board working machine is limited due to the width of the reel holding section.

It is desirable that more tape feeders are able to be installed on the board working machine in accordance with an increase in number of types of the electronic components loaded on the printed circuit board. The tape feeder disclosed in Patent Literature 1 is provided with a movable mechanism which is provided between the feeder main body and the reel holding section. The movable mechanism allows the reel holding section to relatively move with respect to the feeder main body. In this technology, the movable mechanism changes a position of a reel holding section with respect to the feeder main body to avoid a contact state of the reel holding sections between adjacent tape feeders. Accordingly, the number of tape feeders which can be installed on the board working machine is restricted not by the width of the wide reel holding section, but by the width of the narrow feeder main body. In this manner, when the tape feeder is provided with the movable mechanism, it is possible to install more tape feeders on the board working machine.

In recent years, a tape feeder in which the reel holding section holds two reels has been suggested, and an example thereof is disclosed in Patent Literature 2. The feeder main body of this type of tape feeder also automatically feeds the tape from one more reel to the board working machine after the tape from one reel is consumed. Accordingly, since it is possible to omit splicing work of the tape in which manual work is performed, and to replace the reel in which the tape has been consumed while continuing production, production efficiency of the board working machine is improved.

CITATION LIST

Patent Literature

Patent Literature 1: JP-A-2004-47951
Patent Literature 2: JP-A-2014-82454

SUMMARY

When the movable mechanism is employed in the tape feeder provided with the reel holding section at which two reels are held, the board working machine can realize mounting of many types of the electronic components and high production efficiency. However, in a space in which the tape feeder is installed, when being observed by a worker, a part of the reel holding section is disturbed by another reel holding section, and workability of exchanging the reel of which the tape has been consumed deteriorates. An object of the present description is to provide a technology for solving deterioration of workability.

Means for Solving the Problem

A tape feeder according to one embodiment disclosed in the present description is configured to supply the electronic components to a board working machine, and is provided with a reel holding section, a feeder main body, and a movable mechanism. The reel holding section holds a first reel around which a first tape that holds the electronic components is wound, and a second reel around which a second tape that holds the electronic components is wound, at different positions on a reel holding surface. The feeder main body feeds the first tape from the first reel to the board working machine, and automatically feeds the second tape from the second reel to the board working machine after the first tape is consumed. The movable mechanism is provided between the feeder main body and the reel holding section, and allows the reel holding section to relatively move with respect to the feeder main body. The movable mechanism can change the position of the reel holding section with respect to the feeder main body between an upper position and a lower position. The movable mechanism can further change the position of the reel holding section with respect to the feeder main body between a proximity position and a separation position at least at the lower position.

Effects

The movable mechanism of the above-described embodiment can change the position of the reel holding section with respect to the feeder main body between the upper position and the lower position to avoid a contact state of the reel holding sections between adjacent tape feeders. Accordingly, it is possible to install more tape feeders on the board working machine. Furthermore, the movable mechanism of the above-described embodiment can change the position of the reel holding section disposed at the lower position with respect to the feeder main body between the proximity position and the separation position. Accordingly, when the reel holding section disposed at the lower position is placed at the separation position, since the reel holding section is exposed from the reel holding section which is disposed at the upper position, it is possible to easily exchange the reel held by the reel holding section.

DESCRIPTION OF EMBODIMENTS

A tape feeder according to one embodiment disclosed in the present description may be configured to supply electronic components to a board working machine, and may be provided with a reel holding section, a feeder main body, and a movable mechanism. The reel holding section may hold a first reel around which a first tape that holds the electronic components is wound, and a second reel around which a second reel that holds the electronic components is wound, at different positions on a reel holding surface. The electronic components held by the first reel and the electronic components held by the second reel may be the same type, and may be a different type. The reel holding section may hold three or more reels as necessary. The feeder main body may feed the first tape from the first reel to the board working machine, and may automatically feed the second tape from the second reel to the board working machine after the first tape is consumed. In this manner, the tape feeder can automatically perform splicing work of a tape. The movable mechanism may be provided between the feeder main body and the reel holding section, and may allow the reel holding section to relatively move with respect to the feeder main body. The movable mechanism may be capable of changing the position of the reel holding section with respect to the feeder main body between an upper position and a lower position. The movable mechanism may further be capable of changing the position of the reel holding section with respect to the feeder main body between a proximity position and a separation position at least at the lower position.

The movable mechanism may include a guide arm which includes a guide section that extends in parallel to the reel holding surface. In this case, the reel holding section may be configured to be slidable between the proximity position and the separation position along the guide section. In this state, a worker can easily change the position of the reel holding section with respect to the feeder main body between the proximity position and the separation position at least a lower position.

The guide arm may be configured to be capable of moving between a position when the reel holding section is disposed at the upper position and a position when the reel holding section is disposed at the lower position in parallel. In this state, the worker can easily change the position of the reel holding section with respect to the feeder main body between the upper position and the lower position.

The movable mechanism may include a first attachable and detachable section and a second attachable and detachable section which are selectively attachable and detachable due to the guide arm. In this case, when the guide arm is attached to the first attachable and detachable section, the reel holding section is disposed at the upper position. When the guide arm is attached to the second attachable and detachable section, the reel holding section is disposed at the lower position. In this state, an aspect of the movable mechanism is simplified, and the movable mechanism becomes strong against damage.

An opening which extends along the sliding direction of the reel holding section may be formed as the guide section in the guide arm. One pair of grooves including a lower groove formed at a lower edge which defines the opening, and an upper groove formed at an upper edge which defines the opening, may be formed at the opening. The reel holding section may include one pair of rollers which are inserted into the opening of the guide arm. The position of the reel holding section with respect to the feeder main body is fixed when one of the one pair of rollers is fitted to the lower groove, and the other one is fitted to the upper groove. In this state, it is possible to realize positioning of the reel holding section with respect to the feeder main body in the sliding direction by a simple structure.

One pair of grooves may be formed at each of one end portion and the other end portion of the opening of the guide arm. When one pair of rollers are fitted to one pair of grooves which are formed at one end portion of the opening, the reel holding section is disposed at the proximity position. When one pair of rollers are fitted to one pair of grooves which are formed at the other end portion of the opening, the reel holding section is disposed at the separation position. In this state, it is possible to realize the positioning of the reel holding section with respect to the feeder main body between the proximity position and the separation position by a simple structure.

The reel holding section may include a first holding section and a second holding section. The first holding section may be configured to hold the first reel. The second holding section may be disposed further toward a far side from the feeder main body than the first holding section, and may be configured to be capable of moving between a normal position at which the second reel is held and a retracted position which is close to the feeder main body and at which the second reel is not held. In this state, when the second holding section does not hold the second reel, it is possible to achieve a small space by moving the second holding section to the retracted position.

EXAMPLES

Figure 1:
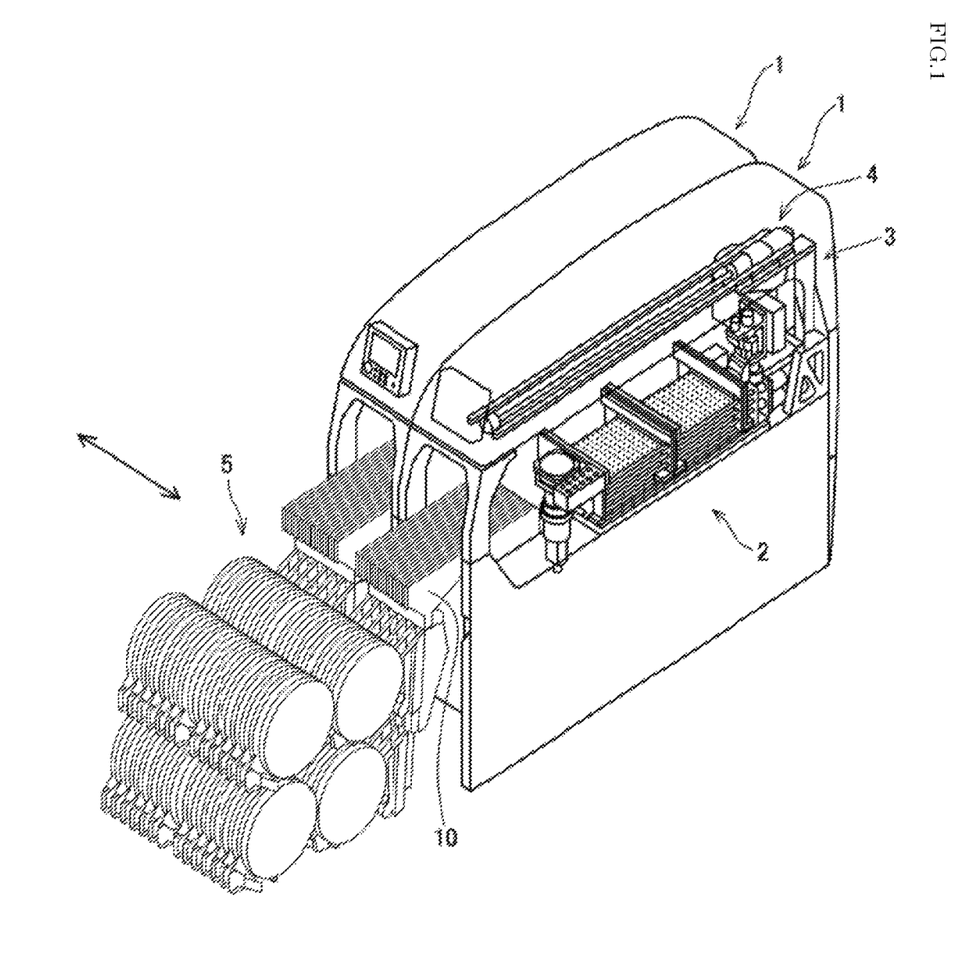
FIG. 1 a view schematically illustrating an outline configuration of an electronic component mounting machine and an electronic component supplying machine installed thereon.

In FIG. 1, an electronic component mounting machine 1 which is used in an electronic component mounting line is illustrated. FIG. 1 shows two electronic component mounting machines 1, and a state where an exterior plate of one electronic component mounting machine 1 is looked through. The electronic component mounting machine 1 is a device which mounts a electronic component on a circuit board, and is provided with a conveyance device 2, a mounting head 3, and a moving device 4. The conveyance device 2 is a double conveyor type, and conveys the circuit board along the conveyance direction (arrow direction illustrated in the drawing). The mounting head 3 which is linked to the moving device 4 has a suction nozzle, and the suction nozzle suctions the section of electronic component. The moving device 4 moves the mounting head 3 on a surface parallel to a front surface of the conveyed circuit board. An electronic component supply device 5 is installed on the electronic component mounting machine 1. The electronic component supply device 5 includes a plurality of tape feeders 10 which are aligned in parallel along the conveyance direction of the circuit board. In this manner, the electronic component mounting machine 1 suctions the electronic components supplied from the tape feeder 10 of the electronic component supply device 5 by the suction nozzle of the mounting head 3, moves the mounting head 3 to the circuit board by using the moving device 4, and mounts the electronic components to a predetermined position of the circuit board.

Figure 2:
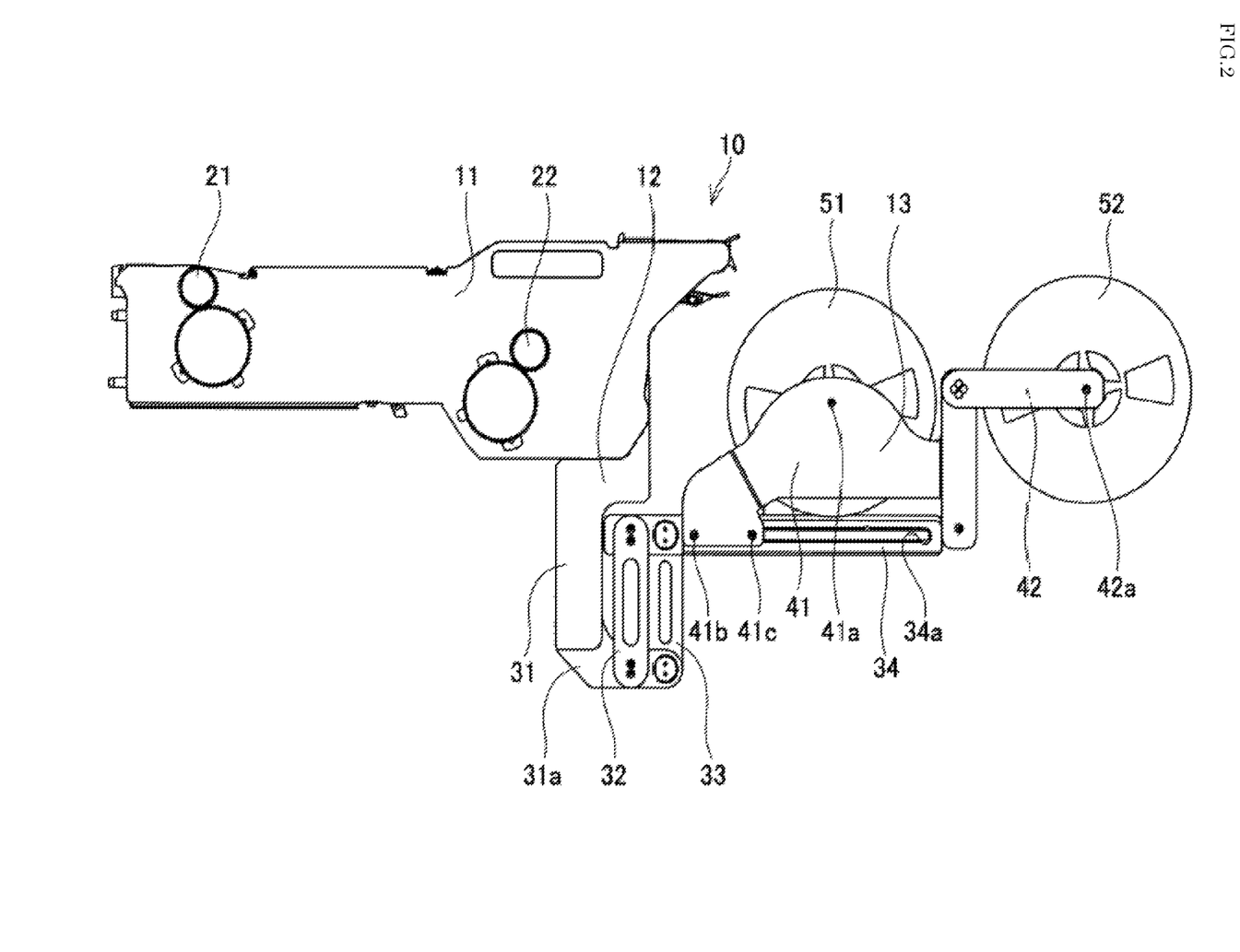
FIG. 2 is a view schematically illustrating an outline configuration of a tape feeder, and is a view illustrating a state where a reel holding section is disposed at an upper position.

In FIG. 2, an outline configuration of the tape feeder is schematically illustrated. In addition, in the following description, regarding the direction in the tape feeder 10, a left side on a paper surface (a side on which the electronic component mounting machine 1 is present when being installed on the electronic component mounting machine 1) is a front side, a right side on a paper surface is a rear side, an upper side on a paper surface (an upper side in the vertical direction when being installed on the electronic component mounting machine 1) is an upper side, a lower side on a paper surface is a lower side, and the depth direction of a paper surface is the conveyance direction of the circuit board.

As illustrated in FIG. 2, the tape feeder 10 includes a feeder main body 11, a movable mechanism 12, and a reel holding section 13. The tape feeder 10 is a type which is called an auto loading feeder, and holds two reels 51 and 52. The first tape (hereinafter, referred to as a feeding tape) at which the electronic component is held at a constant pitch interval, is wound around the first reel 51. The second tape (hereinafter, referred to as a waiting tape) at which the electronic component is held at a constant pitch interval, is wound around the second reel 52. The electronic components held by the feeding tape, and the electronic components held by the waiting tape, are the same type. The first reel 51 and the second reel 52 are held at different positions on the reel holding surface orthogonal to the conveyance direction of the circuit board. The reel holding surface is also a surface on which the feeder main body 11 is present.

The feeder main body 11 is configured to be attachable to and detachable from a frame of the electronic component supply device 5, and includes a first sprocket 21 and a second sprocket 22. The first sprocket 21 and the second sprocket 22 are configured to be rotatable being synchronized with each other. The first sprocket 21 and the second sprocket 22 are engaged with a feeding hole which is formed in the feeding tape from the first reel 51, and pitch-feeds the feeding tape to a component suction position along a tape guide (not illustrated). A tip end of the waiting tape from the second reel 52 waits above the second sprocket 22. After the feeding tape is consumed, the feeder main body 11 moves the waiting tape which waits above the second sprocket 22 downward, and engages the second sprocket 22 with the feeding hole formed in the waiting tape. In this manner, the feeder main body 11 is configured to automatically feed the waiting tape to the electronic component mounting machine 1 after the feeding tape is consumed, and can omit the splicing work of the tape which has been manually performed. Accordingly, since work efficiency of the worker is improved, and stop of production which is caused when the splicing work is forgotten or missed is prevented, the production efficiency of the electronic component mounting machine 1 is improved.

The movable mechanism 12 is configured to allow the reel holding section 13 to relatively move with respect to the feeder main body 11, and includes a support arm 31, one pair or links 32 and 33, and a guide arm 34. In the support arm 31, an upper end portion is fixed to a rear end portion of the feeder main body 11, extends in parallel to the reel holding surface, and extends downward from a rear end portion of the feeder main body 11. The lower end portion of the support arm 31 includes a connecting section 31a which extends rearward. The first link 32 extends in parallel to the reel holding surface, one end thereof is linked to the connecting section 31a of the support arm 31 to be rotatable, and the other end thereof is linked to a front end portion of the guide arm 34 to be rotatable. The second link 33 also extends in parallel to the reel holding surface, one end thereof is linked to the connecting section 31a of the support arm 31 to be rotatable, and the other end thereof is linked to the front end portion of the guide arm 34 to be rotatable. Between the connecting section 31a of the support arm 31 and the guide arm 34, the first link 32 and the second link 33 have the same length. Accordingly, the guide arm 34 is configured to be movable in parallel on a surface parallel to the reel holding surface.

Figure 3:
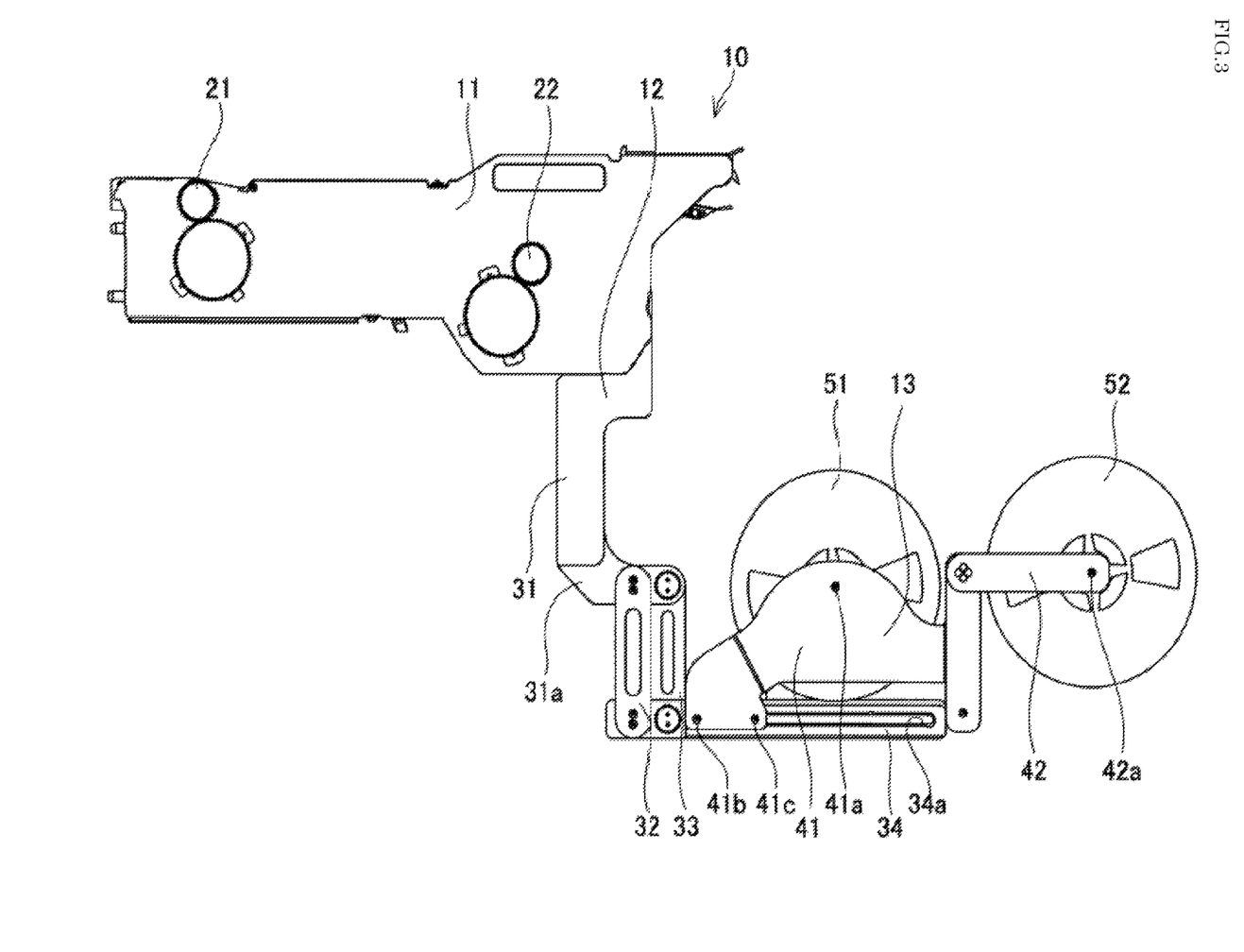
FIG. 3 is a view schematically illustrating an outline configuration of the tape feeder, and is a view illustrating a state where the reel holding section is disposed at a lower position.

In FIGS. 2 and 3, an aspect in which the guide arm 34 moves in parallel is illustrated. The movable mechanism 12 can change a position of the reel holding section 13 with respect to the feeder main body 11 between the upper position (refer to FIG. 2) and the lower position (refer to FIG. 3) by moving the guide arm 34 in parallel by using one pair of links 32 and 33. As illustrated in FIGS. 2 and 3, an existence range when the reel holding section 13 and one pair of reels 51 and 52 are the upper position, does not overlap an existence range when the reel holding section 13 and one pair of reels 51 and 52 are at the lower position. Therefore, as illustrated in FIG. 1, when the plurality of tape feeders 10 are installed on the electronic component mounting machine 1, if the reel holding section 13 disposed at the upper position and the reel holding section disposed at the lower position are alternately set along the conveyance direction, a contact state of the reel holding section 13 between the adjacent tape feeders 10 are avoided. Since the reel holding section 13 is configured to be wider than the feeder main body 11, by avoiding the contact state of the reel holding section 13, the number of tape feeders 10 which can be installed on the electronic component mounting machine 1 is restricted not by the width of the wide reel holding section 13, but by the width of the narrow feeder main body 11. Accordingly, since more tape feeders 10 can be installed on the electronic component mounting machine 1, the electronic component mounting machine 1 can mount many types of electronic components on the circuit board.

As illustrated in FIG. 2, the reel holding section 13 includes a first holding section 41 and a second holding section 42. The first holding section 41 is disposed further toward a near side from the feeder main body 11 than the second holding section 42. The first holding section 41 includes an engaging pin 41a, and the engagement pin 41a is engaged with a rotating shaft hole of the first reel 51, and holds the first reel 51 to be rotatable. The second holding section 42 is disposed further toward a far side from the feeder main body 11 than the first holding section 41, and is configured of a rectangular plate member. In the second holding section 42, the front end portion is linked to the first holding member 41 to be rotatable. The second holding section 42 also includes an engaging pin 42a in the rear end portion, and the engagement pin 42a is engaged with the rotating shaft hole of the second reel 52, and holds the second reel 52 to be rotatable.

Figure 4:
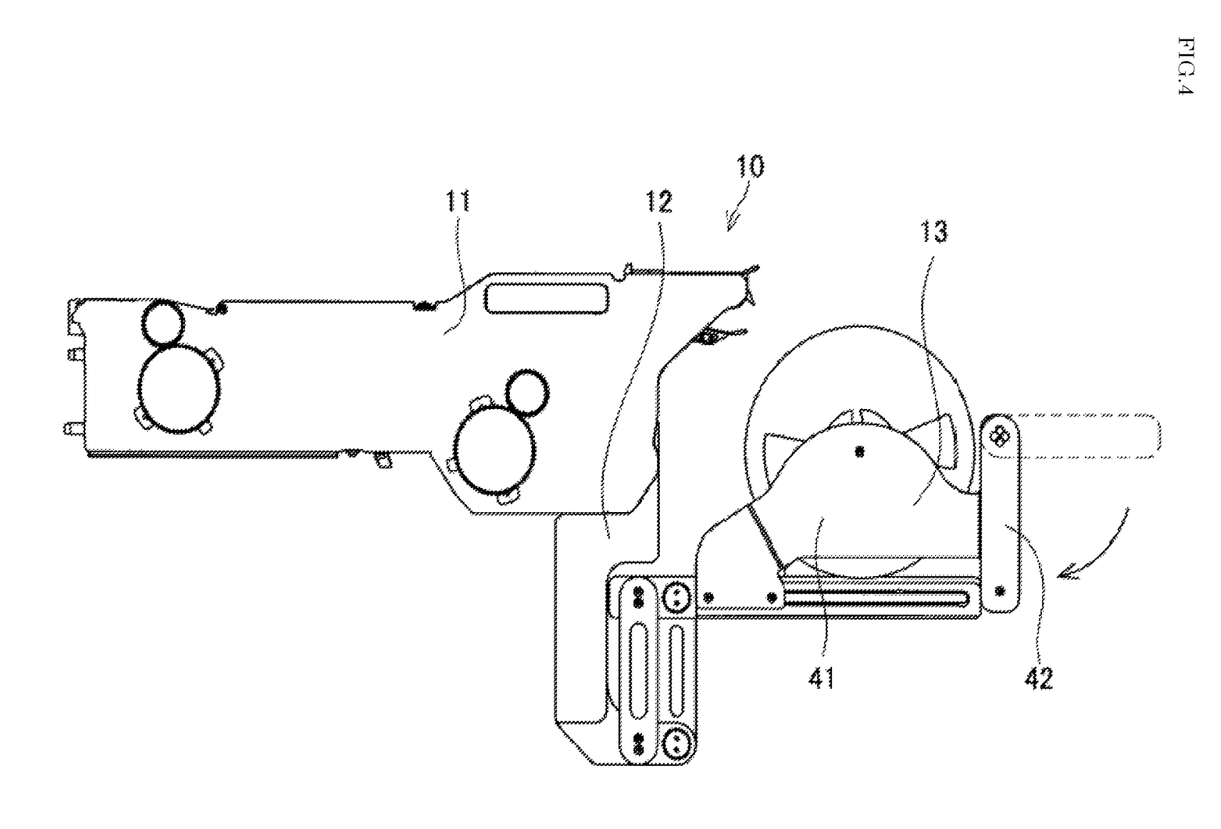
FIG. 4 is a view illustrating an aspect in which a second holding section of the reel holding section moves between a normal position and a retracted position.

When the second holding section 42 is positioned at a position in which the longitudinal direction is parallel to the forward-and-rearward direction, that is, at a position at which the engagement pin 42a is separated the most from the engaging pin 41a of the first holding section 41, the second reel 52 is stably held. Meanwhile, as illustrated in FIG. 4, for example, in a case where the number of electronic components required for the circuit board to be produced is small, and is sufficient as the electronic components of the first reel 51, the second holding section 42 is folded to the first holding section 41 side, and is accommodated on a side of the first holding section 41. Accordingly, since the width in the forward-and-rearward direction of the tape feeder 10 becomes short, reduction of a space of the electronic component supply device 5 is achieved.

As illustrated in FIG. 2, the first holding section 41 includes one pair of rollers 41b and 41c. One pair of rollers 41a and 41b consider the conveyance direction of the circuit board as a rotating shaft, and are inserted into an opening 34a formed in the guide arm 34. The opening 34a of the guide arm 34 extends along the forward-and-rearward direction. One pair of rollers 41a and 41b move to be guided to the opening 34a of the guide arm 34. Accordingly, the reel holding section 13 is configured to be slidable in the forward-and-rearward direction along the guide arm 34, and is configured to be movable between the proximity position that is close to the feeder main body 11 and the separation position that is separated from the feeder main body 11.

Figure 5A:
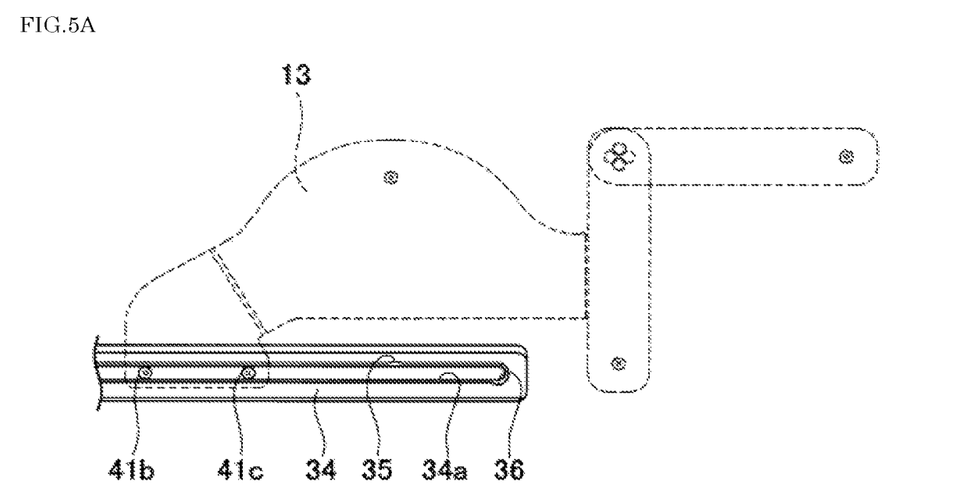
FIG. 5A is a view schematically illustrating a view in which main portions of a rear end portion of a guide arm are enlarged, and is a view illustrating a state where one pair of rollers are not fitted to one pair of grooves.
Figure 5B:
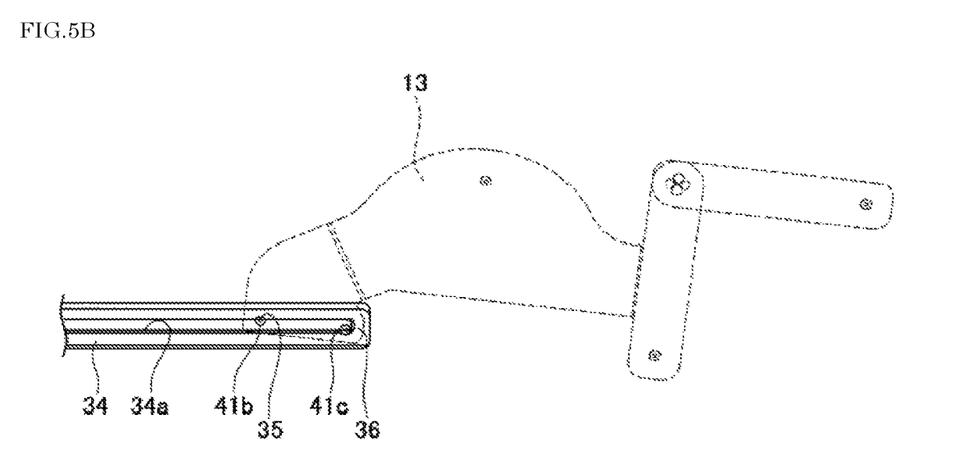
FIG. 5B is a view schematically illustrating a view in which the main portions of the rear end portion of the guide arm are enlarged, and is a view illustrating a state where one pair of rollers are fitted to one pair of grooves.

In FIG. 5A, a view in which main portions of the rear end portion of the guide arm 34 are enlarged is schematically illustrated. In the opening 34a of the guide arm 34, one pair of grooves 35 and 36 including an upper groove 35 formed at an upper edge that defines the opening 34a, and a lower groove 36 formed at a lower edge that defines the opening 34a, are formed. The upper groove 35 is formed further forward than the lower groove 36. Since the reel holding section 13 is formed to extend to the rear side from the one pair of rollers 41a and 41b, in the reel holding section 13, a self-weighting torque is generated clockwise considering the one pair of rollers 41a and 41b as a rotating shaft. Therefore, as illustrated in FIG. 5B, when the front roller 41b among the one pair of rollers 41a and 41b is fitted to the upper groove 35, and the rear roller 41c is fitted to the lower groove 36, the reel holding section 13 is fixed to the separation position. One pair of grooves having similar structure are also formed in the front end portion of the opening 34a of the guide arm 34, and accordingly, the reel holding section 13 is fixed to the proximity position.

As described above, the tape feeder 10 of the embodiment can automatically supply the waiting tape from the second reel 52 to the electronic component mounting machine 1 after the feeding tape from the first reel 51 is consumed. Furthermore, before the waiting tape from the second reel 52 is consumed, the worker takes out the first reel 51 in which the feeding tape is consumed from the first holding section 41, moves the second reel 52 to the first holding section 41, and replenishes new reel to the second holding section 42. Accordingly, since it is not necessary to stop the production for exchanging the reel, production efficiency of the electronic component mounting machine 1 is improved.

Figure 6:
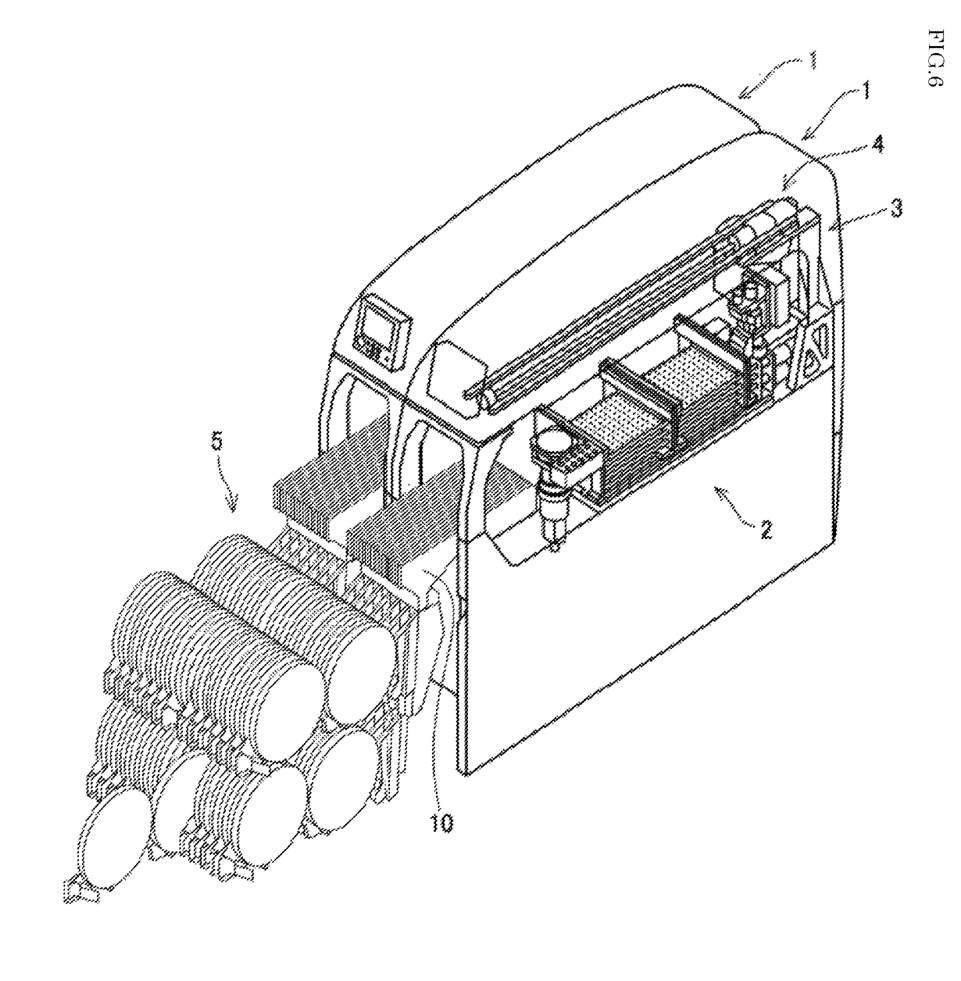
FIG. 6 is a view schematically illustrating an outline configuration of the electronic component mounting machine and the electronic component supplying machine installed thereon, and is a view illustrating an aspect when the reel holding section which is at the lower position is disposed at a separation position.

As illustrated in FIG. 6, in the tape feeder 10 of the embodiment, the reel holding section 13 disposed at the upper position and the reel holding section 13 disposed at the lower position are alternately set along the conveyance direction of the circuit board. Therefore, in particular, the first holding section 41 of the reel holding section 13 disposed at the lower position is disturbed by the reel holding section 13 disposed at the upper position when being observed by the worker. In the tape feeder 10 of the embodiment, the reel holding section 13 is configured to be movable between the proximity position and the separation position. Accordingly, when the reel holding section 13 disposed at the lower position is placed at the separation position, since the reel holding section 13 is exposed from the reel holding section 13 disposed at the upper position, it is possible to easily exchange the reel held by the reel holding section 13.

Figure 7:
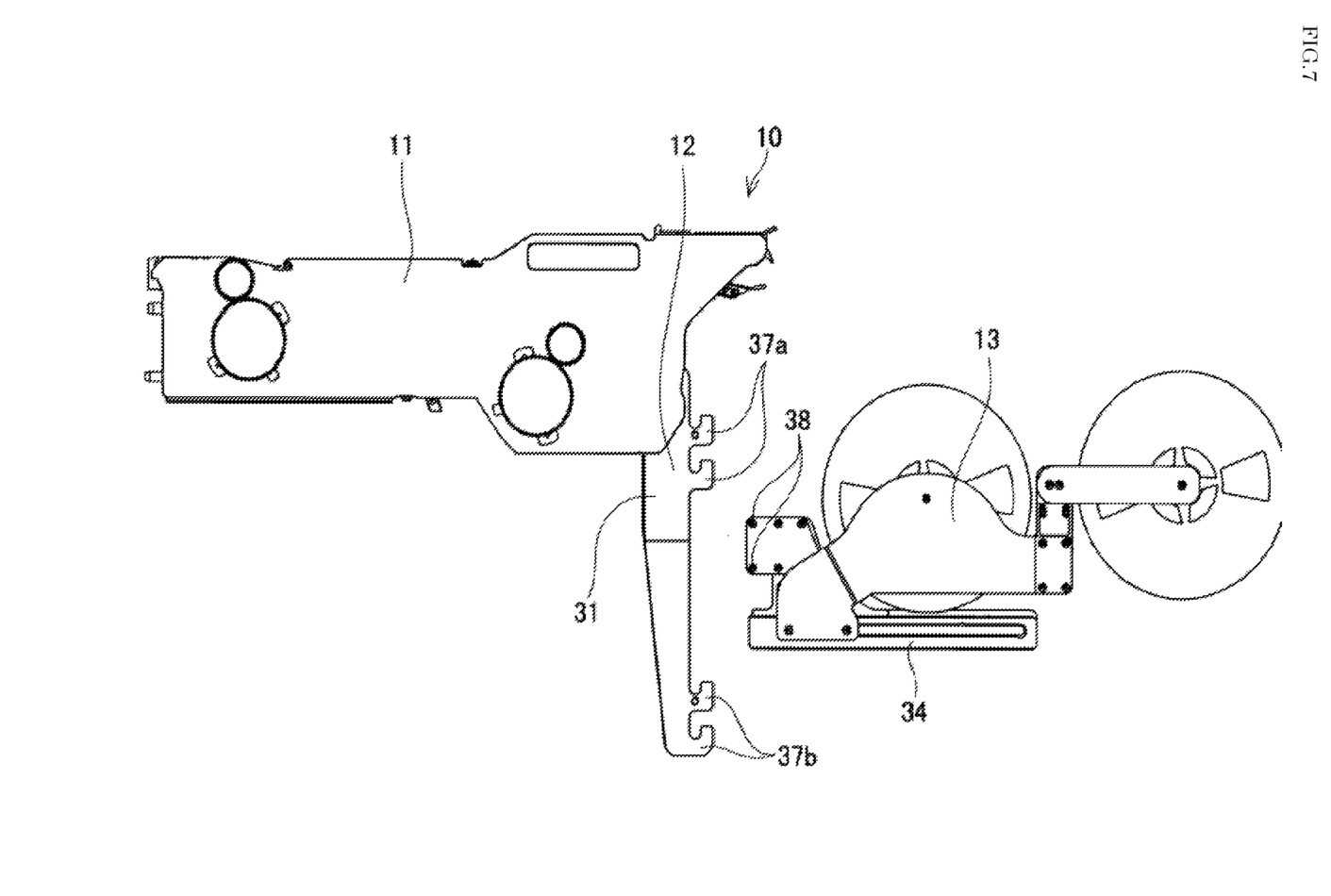
FIG. 7 is a view schematically illustrating an outline configuration of the tape feeder, and is a view schematically illustrating an outline configuration of a movable mechanism of an alternative embodiment.

In the above-described embodiment, an example in which the guide arm 34 moves in parallel between the upper position and the lower position by using the one pair of links 32 and 33 is illustrated. As illustrated in FIG. 7, instead of the above-described embodiment, the guide arm 34 may move between the upper position and the lower position by using an attachable and detachable mechanism. The support arm 31 which is an example thereof includes one pair of upper engagement hooks 37a and one pair of lower engagement hooks 37b. Furthermore, the guide arm 34 includes one pair of engaging pins 38 which are formed in the front end portion. The guide arm 34 is disposed at the upper position when one pair of engaging pins 38 are engaged with the upper engagement hook 37a, and is disposed at the lower position when one pair of engaging pins 38 are engaged with the lower engagement hook 37b. The attachable and detachable mechanism achieves a simple aspect, and has characteristics of being strong against damage.

Above, specific examples of the present disclosure are illustrated in detail, but these are merely examples, and do not limit the range of claims. In the technology described in the range of claims, various modifications and changes of the specific examples illustrated above are included.

Technical elements described in the present description or the drawings achieve technical usability as being used independently or being combined with each other, and the present disclosure is not limited to the combination of the described claims when applying the patent. In addition, the technology illustrated in the present description or the drawings achieves a plurality of objects at the same time, and has technical usability only by achieving one of the objects.

REFERENCE SIGNS LIST

10: tape feeder
11: feeder main body
12: movable mechanism
13: reel holding section
21: first sprocket
22: second sprocket
31: support arm
32: first link
33: second link
34: guide arm
41: first holding section
42: second holding section
51: first reel
52: second reel

The invention claimed is:

1. A tape feeder which supplies electronic components to a board working machine, comprising:
   a reel holding section at which a first reel around which a first tape that holds the electronic components is wound is held, and a second reel around which a second tape that holds the electronic components is wound, at different positions on a reel holding surface;
   a feeder main body which feeds the first tape from the first reel to the board working machine, and automatically feeds the second tape from the second reel to the board working machine after the first tape is consumed; and a movable mechanism which is provided between the reel holding section and the feeder main body, and allows the reel holding section to relatively move with respect to the feeder main body, wherein the movable mechanism is capable of changing the position of the reel holding section with respect to the feeder main body between an upper position and a lower position, and is capable of changing the position of the reel holding section between a proximity position and a separation position at least at the lower position; wherein the movable mechanism includes a guide arm having a guide section that extends in parallel to the reel holding surface, and wherein the reel holding section is configured to be slidable between the proximity position and the separation position along the guide section; wherein an opening which extends along the sliding direction of the reel holding section is formed as the guide section in the guide arm, wherein one pair of grooves including a lower groove formed at a lower edge which defines the opening, and an upper groove formed at an upper edge which defines the opening, are formed at the opening, wherein the reel holding section includes one pair of rollers which are inserted into the opening of the guide arm, and wherein the position of the reel holding section with respect to the feeder main body is fixed when one of the one pair of rollers is fitted to the lower groove, and the other one is fitted to the upper groove.

2. The tape feeder according to claim 1, wherein the guide arm is configured to be capable of moving in parallel between a position when the reel holding section is disposed at the upper position, and a position when the reel holding section is disposed at the lower position.

3. The tape feeder according to claim 1, wherein the movable mechanism includes a first attachable and detachable section and a second attachable and detachable section which are selectively attachable and detachable due to the guide arm, wherein the reel holding section is disposed at the upper position when the guide arm is attached to the first attachable and detachable section, and wherein the reel holding section is disposed at the lower position when the guide arm is attached to the second attachable and detachable section.

4. The tape feeder according to claim 1, wherein the one pair of grooves are respectively formed at one end portion and at the other end portion of the opening of the guide arm, wherein the reel holding section is disposed at the proximity position when the one pair of rollers are fitted to the one pair of grooves which are formed at one end portion of the opening, and wherein the reel holding section is disposed at the separation position when the one pair of rollers are fitted to the one pair of grooves which are formed at the other one end portion of the opening.

5. The tape feeder according to claim 1, wherein the reel holding section includes a first holding section and a second holding section, wherein the first holding section is configured to hold the first reel, and wherein the second holding section is disposed further toward a far side from the feeder main body than the first holding section, and is configured to be capable of moving between a normal position at which the second reel is held and a retracted position which is close to the feeder main body and at which the second reel is not held.

* * * * *